US006529072B2

United States Patent
Takada

(10) Patent No.: US 6,529,072 B2
(45) Date of Patent: Mar. 4, 2003

(54) PREDISTORTION-BASED AMPLIFIER, TRANSMITTER AND ENVELOPE DETECTOR

(75) Inventor: Toshio Takada, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 09/963,555

(22) Filed: Sep. 27, 2001

(65) Prior Publication Data

US 2002/0097089 A1 Jul. 25, 2002

(30) Foreign Application Priority Data

Jan. 25, 2001 (JP) .......................... 2001-016867

(51) Int. Cl.[7] .............. H03F 1/30; H03G 3/20
(52) U.S. Cl. ............... 330/149; 330/136; 330/138
(58) Field of Search .................. 330/149, 136, 330/138

(56) References Cited

U.S. PATENT DOCUMENTS 4,465,980 A * 8/1984 Huang et al. ............... 330/149
5,703,530 A * 12/1997 Sato et al. .................. 330/149
6,337,599 B2 * 1/2002 Lee ........................... 330/149
6,388,518 B1 * 5/2002 Miyatani .................... 330/149

* cited by examiner

*Primary Examiner*—Patricia Nguyen
(74) *Attorney, Agent, or Firm*—Wenderoth, Lind & Ponack, L.L.P.

(57) ABSTRACT

A predistortion-based amplifier which compensates for distortions generated by the amplifier when a modulated wave signal is amplified thereby in accordance with a predistortion scheme, based on envelope information of the modulated wave information. An envelope information detector for detecting information related to the envelope of the modulated signal to be amplified comprises, between an input terminal A1 and an output terminal A2, matching circuits 11, 14, diode circuits 12, 15, 16 for rectifying the modulated wave signal, a stub circuit 13 for removing a carrier component of the signal output from the diode circuits, and a signal converter circuit 17 for converting an envelope signal output from the stub circuit from a current signal to a voltage signal.

10 Claims, 9 Drawing Sheets

PREDISTORTION-BASED AMPLIFIER, TRANSMITTER AND ENVELOPE DETECTOR

BACKGROUND OF THE INVENTION

1. Field of the Invention

The present invention relates to a predistortion-based amplifier for compensating for distortion generated thereby when it amplifies a modulated wave signal based on envelope information of the modulated wave signal in accordance with a predistortion scheme, and more particularly, to a predistortion-based amplifier for improving an envelope information detecting efficiency and detecting accuracy.

2. Description of the Related Art

The predistortion scheme, which is known as a technique for linearizing amplifiers, detects an envelope using an envelope detector to compensate for distortions generated by an amplifier based on the result of the detection.

The predistortion scheme will now be described.

In a power amplifier used in a transmitter, its input/output characteristics include nonlinearity which causes distortions, resulting in unnecessary power radiation to the outside of a transmission frequency band. This causes interfering power to other frequency bands. For this reason, such a power amplifier is required to minimize the distortions generated thereby.

Also, since the power amplifier is a component which consumes large power, a reduction in power consumption of the power amplifier is regarded as an important issue because in a base station unit of a portable telephone system or the like, for example, a power amplifier consumes a majority of the power consumed by the base station unit.

However, for realizing a linear amplification using a power amplifier, it is necessary to operate the power amplifier in a region in which a direct current-to-alternating current converting efficiency (in this disclosure, hereinafter simply referred to as the "efficiency") is low. In other words, an improvement on the nonlinearity of the power amplifier and a reduction in power consumption are in a mutually conflicting relationship, so that it is a difficult challenge to simultaneously solve the two problems.

As a method for simultaneously solving the two problems as mentioned, the predistortion scheme has been proposed.

The predistortion scheme is one approach to reduce distortions which applies, for example, distortions opposite to those generated by a power amplifier to a stage previous to an input of the power amplifier (distortion for canceling the distortions generated by the power amplifier) to improve the distortion characteristic of the power amplifier. In addition to this predistortion scheme, a scheme which applies such opposite distortions in a baseband is referred to as a baseband predistortion scheme; a scheme which applies such opposite distortions in an intermediate frequency (IF) band is referred to as an IF predistortion scheme; and a scheme which applies such opposite distortions in a radio frequency (RF) band is referred to as an RF predistortion scheme.

Generally, the nonlinearity found in transmission power amplifiers is divided into an amplitude component and a phase component. Then, the nonlinearity in the amplitude component is generally represented by how the gain changes with respect to input power supplied to a power amplifier, referred to as an AM (Amplitude Modulation)—AM characteristic. The nonlinearity in the phase component in turn is represented by how the phase rotates with respect to the input power supplied to the power amplifier, referred to as an AM-PM (Phase Modulation) characteristic.

The predistortion scheme as mentioned above uses, for example, a voltage controlled variable attenuator to generate distortions having an opposite characteristic to the AM-AM characteristic of a power amplifier at a stage previous to the power amplifier, and uses a voltage controlled variable phaser to generate distortions having an opposite characteristic to the AM-PM characteristic at a stage previous to the power amplifier, thereby reducing distortions in amplitude and phase generated by the power amplifier.

In the RF predistortion scheme and IF predistortion scheme, for example, a variable attenuator and a variable phase must be operated in accordance with the envelope of a high frequency signal which is to be amplified. Generally, with a transmission bandwidth of 20 MHz, by way of example, the envelope has a frequency component of 20 MHz at maximum. Therefore, such a predistortion scheme requires an envelope information detector circuit which has an input bandwidth as wide as the transmission bandwidth.

Exemplary configurations of circuits using the predistortion schemes as mentioned above are disclosed, for example, in Japanese Patent Application Laid-Open No. 2000-69098 and Japanese Patent Application No. 2000-260214.

Next, the envelope information detector used in the aforementioned RF predistortion scheme and IF predistortion scheme will be described.

FIG. 9 illustrates an exemplary circuit configuration of an envelope information detector which may be included in a conventional predistortion-based amplifier. The illustrated envelope information detector comprises a matching capacitor 41, a diode 42, a matching coil 43, an RF choke coil 44, a biasing voltage source 45, a capacitor 46, and a resistor 47. For the diode 42, a Schottky diode, for example, is employed because of its ability to operate at a high speed and detect high frequencies.

Specifically, in the envelope information detector illustrated in FIG. 9, an input terminal D1 which receives a modulated wave signal is connected to one end of the matching capacitor 41, the other end of which is connected to an anode of the diode 42. A cathode of the diode 42 is connected to an output terminal D2. A point between the input terminal D1 and the matching capacitor 41 is grounded through the matching coil 43, and the biasing voltage source 45 is connected between the matching capacitor 41 and the diode 42 through the RF choke coil 44. Also, one end of the capacitor 46 and one end of the resistor 47 are connected in parallel between the diode 42 and the output terminal D2, and the other end of the capacitor 46 and the other end of the resistor 47 are grounded.

Also, in the envelope information detector illustrated in FIG. 9, the matching capacitor 41 and the matching coil 43 constitute a matching circuit, while the capacitor 46 and the resistor 47 constitute a low pass filter (LPF).

An exemplary operation of the envelope information detector illustrated in FIG. 9 will be described below.

In the envelope information detector, a modulated wave signal input to the input terminal D1 is applied to the anode of the diode 42 through the matching circuit. At the anode of the diode 42, the input modulated wave signal is provided as a voltage signal. Also, for example, if the capacitor 46 has a sufficiently large capacitance with respect to the carrier frequency of the modulated wave signal so that it is regarded as being short-circuited at the carrier frequency in the AC domain, the modulated wave signal provided at the anode of the diode 42 is converted to a current signal by the diode 42.

Simultaneously, the modulated wave signal is rectified by the ON-OFF characteristic of the diode 42, whereby the modulated wave signal is separated into a carrier component and an envelope component. Then, the carrier component included in the converted current signal is removed by the LPF, so that the envelope component alone is detected by the resistor 47 as a voltage signal which is output from the output terminal D2.

With the operation as described above, the envelope information detector detects the envelope component of the input modulated wave signal.

As an example of conventional techniques, a modulated output detector circuit for a radio device described in Japanese Patent Application Laid-Open No. 5-251971 uses a quarter wavelength transmission path which functions as a diode or a filter for detecting a modulated output from a high power amplifier, resistor for leading out a detected output, and so on in an ALC (Automatic Level Control) circuit for controlling the transmission power to a predetermined state to input a predetermined detected output to a control signal detected output converter circuit, thereby adjusting the amount of attenuation of the input to the high power amplifier to hold the output from the high power amplifier at a predetermined level.

However, in the envelope information detector for the conventional predistortion-based amplifier as illustrated in FIG. 9, for example, although the envelope detecting efficiency can be improved by increasing the capacitance of the capacitor 46 and the resistance of the resistor 47 connected to the output terminal of the diode 42, the increase in the capacitance of the capacitor 46 and the resistance of the resistor 47 results in a larger time constant to lose high frequency components within the envelope component, so that a detected envelope is corrupted, in other words, the envelope detecting accuracy is deteriorated. As appreciated, in the conventional envelope information detector, the envelope detecting efficiency and detecting accuracy are in a mutually conflicting relationship, thus encountering difficulties in simultaneously improving both. Thus, the conventional predistortion-based amplifier is problematic in that a distortion compensating accuracy and so on are worsened.

SUMMARY OF THE INVENTION

The present invention has been made to solve the problems of the prior art as described above, and its object is to provide a predistortion-based amplifier which is capable of improving the envelope information detecting efficiency and detecting accuracy for compensating for distortions generated by the amplifier, when it amplifies a modulated wave signal, based on envelope information of the modulated wave signal in accordance with a predistortion scheme.

To achieve the above object, the predistortion-based amplifier according to the present invention forms an envelope information detector using a stub circuit for removing a carrier component of a modulated wave signal. Distributing means distributes the modulated wave signal to be amplified, distortion generating means generates distortions in at least one of amplitude and phase of one distributed signal, the envelope information detector detects information related to the envelope of the other distributed signal when the amplifier amplifies the one distributed signal in which distortions have been generated by the distortion generating means, and distortion control means controls the distortions generated by the distortion generating means based on the result of a detection by the envelope information detector such that distortions generated by the amplifier is compensated for.

Since the carrier component of the modulated wave signal is removed by the stub circuit, the envelope information detector can improve both the envelope information detecting efficiency and detecting accuracy, thereby making it possible to improve a distortion compensating accuracy and so on in accordance with the predistortion scheme.

Here, as modulated signals amplified by the amplifier, a variety of signals may be used.

The distortion generating means may generate, for example, both amplitude distortions and phase distortions, or may generate, for example, only amplitude distortions, or may generate, for example, only phase distortions. Means for generating amplitude distortions may be implemented, for example, by amplitude changing means such as a variable attenuator which changes the amplitude of a signal. Means for generating phase distortions may be implemented, for example, by phase changing means such as a variable phaser which changes the phase of a signal.

As the information related to the envelope (envelope information) detected by the envelope information detector, a variety of information may be used. For example, continuous or discrete detection of information on the level of the envelope, and so on may be used. Specifically, in the predistortion-based amplifier, the envelope information detector may detect information which enables the predistortion-based distortion compensation to be effectively carried out in practice.

The control for compensating distortions generated by the amplifier (for reducing the distortions) is preferably conducted, for example, to suppress the distortions generated by the amplifier to a minimum (ideally, zero). However, another manner of control may be used as long as it is effective in a practical use.

The distortions generated by the distortion generating means may be controlled, for example, by controlling the amount of amplitude distortions or phase distortions generated by the distortion generating means.

As the stub circuit, a variety of circuits may be used. Specifically, a circuit comprised only of a stub, for example, may be used, or a circuit comprised of a stub and another circuit may be used. Also, as the shape of the stub, a variety of shapes may be used.

The stub circuit may remove the carrier component of a modulated wave signal to such a degree that envelope information can be effectively detected in practice, so that the carrier component need not be suppressed to zero.

In the predistortion-based amplifier according to the present invention, the envelope information detector includes a diode circuit for rectifying the other distributed signal, and a stub circuit for removing a carrier component of the signal output from the diode circuit (the carrier component of the modulated wave signal), as a more specific exemplary configuration.

With this configuration, the envelope information detecting efficiency can be improved in accordance with the characteristic of the stub circuit, and the envelope information detecting accuracy can be improved in accordance with the characteristic of the diode circuit, thereby making it possible to improve both the envelope information detecting efficiency and detecting accuracy.

Here, as the diode circuit, a variety of circuits may be used. Specifically, a circuit comprised only of a diode, for example, may be used, or a circuit comprised of a diode and another circuit may be used.

In the predistortion-based amplifier according to the present invention, the envelope information detector includes a matching circuit disposed at a stage previous to the diode circuit, and a signal converter circuit for converting an envelope signal output from the stub circuit from a current signal to a voltage signal, as a more specific exemplary configuration.

Also, in the predistortion-based amplifier according to the present invention, as a preferred exemplary configuration, the stub circuit of the envelope information detector is implemented as a notch filter using an L-shaped microstrip line, one side of which is used as a stub portion.

Further, in the predistortion-based amplifier according to the present invention, the stub circuit of the envelope information detector has a plurality of stub portions, in which case an impedance can be minimized, for example, in a frequency range having certain width, as shown in an embodiment, later described.

Therefore, even when the frequency band of a modulated wave signal to be amplified has certain width, the envelope information detecting efficiency and detecting accuracy can be improved in such a frequency region having certain width, thereby making it possible to improve the distortion compensating accuracy and so on in accordance with the predistortion scheme.

Here, the number of stub portions included in the stub circuit may be a variety of numbers depending, for example, on a situation in which a system is used, and so on.

In the predistortion-based amplifier according to the present invention, as a preferred exemplary configuration, the stub circuit of the envelope information detector is implemented as a band elimination filter (BEF) using an inverted C-shaped microstrip line, in which case two opposing sides of the C-shaped microstrip line are used as stub portions, respectively.

Also, in the predistortion-based amplifier according to the present invention, as a preferred exemplary configuration, the stub portions included in the stub circuit of the envelope information detector has a length chosen to be equal to one quarter (or approximately one quarter) of the wavelength of the carrier component of the modulated wave signal.

The predistortion-based amplifier according to the present invention is preferably applied, for example, to a transmitter.

Specifically, a transmitter according to the present invention comprises a predistortion-based amplifier having a variety of configurations as shown above, and amplifies a modulated wave signal to be transmitted using the ppredistortion-based amplifier before transmission.

The signal maybe transmitted, for example, through a wired communication, or for example, through a radio communication.

The predistortion-based amplifier including a stub circuit having a plurality of stub portions is preferably applied to a transmitter for use in a mobile radio communication system which employs, for example, a CDMA (code division multiple access) scheme such as a W-CDMA (Wideband-Code Division Multiple Access) scheme for transmitting a wideband signal.

Specifically, a CDMA transmitter according to the present invention includes a predistortion-based amplifier including a stub circuit having a plurality of stub portions, and amplifies a modulated wave signal to be transmitted using the predistortion-based amplifier before transmission.

Here, as the mobile radio communication system, a variety of systems, for example, a portable telephone system and so on may be used.

As described above, the envelope information detector included in the predistortion-based amplifier according to the present invention detects envelope information by a method of detecting information related to the envelope of a modulated wave signal using the stub circuit for removing the carrier component of the modulated wave signal, thereby realizing the detection of the envelope information with a high detecting efficiency and a high detecting accuracy.

As an example, an envelope detector according to the present invention includes a diode circuit for rectifying a modulated wave signal, and a stub circuit for removing a carrier component of a signal output from the diode circuit to detect information related to the envelope of the modulated wave signal, thereby realizing the advantages as described above.

DESCRIPTION OF THE PREFERRED EMBODIMENTS

Several embodiments according to the present invention will hereinafter be described with reference to the accompanying drawings.

First, a predistortion-based amplifier according to the present invention will be generally shown as an exemplary configuration.

Figure 1:
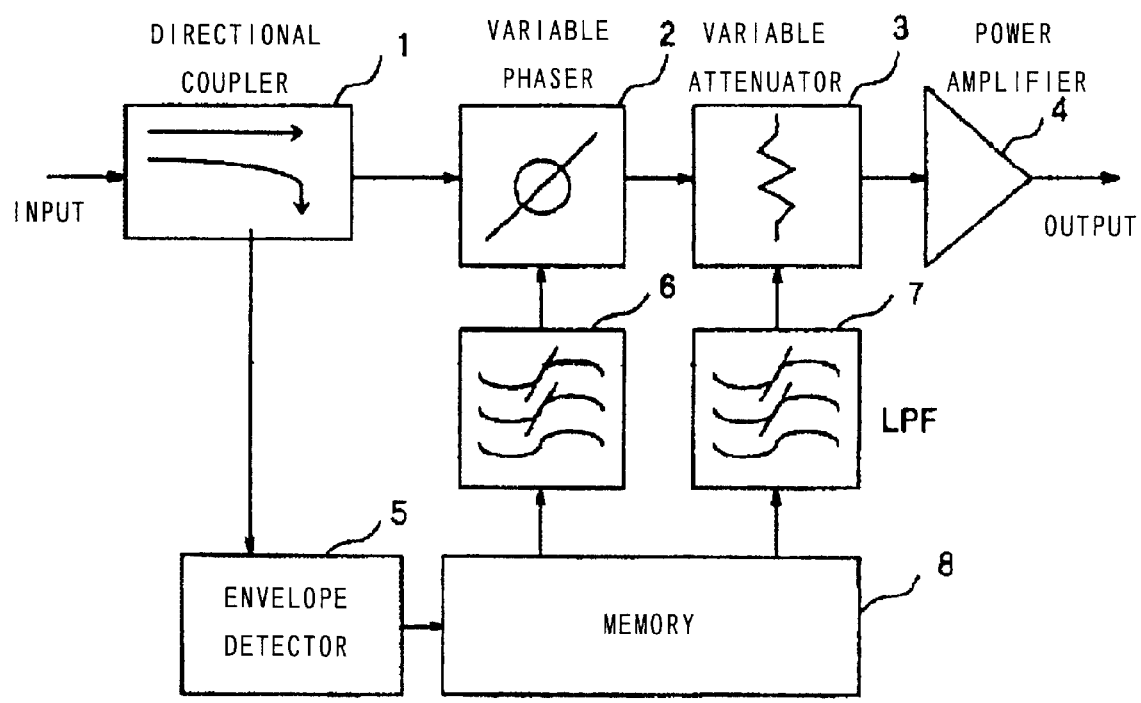
FIG. 1 is a block diagram illustrating an example of a predistortion-based amplifier according to the present invention.

FIG. 1 illustrates an exemplary configuration of the predistortion-based amplifier according to the present invention. The illustrated predistortion-based amplifier comprises a directional coupler 1, a voltage controlled variable phaser 2, a voltage controlled variable attenuator 3, a power amplifier 4, an envelope detector 5, two low pass filters (LPF) 6, 7, and a memory 8.

The directional coupler 1 receives a modulated wave signal which is to be amplified by the power amplifier 4. The directional coupler 1 distributes the input modulated wave signal into two signals, one of which is output to the variable phaser 2, and the other of which is output to the envelope detector 5.

The variable phaser 2 has a function of changing the phase of the one distributed signal input from the directional coupler 1 with the amount of change in phase controlled by a voltage signal input from the LPF 6 to generate phase distortions in the one distributed signal. The variable phaser 2 outputs the one distributed signal applied with the phase distortions in this way (including the amount of distortions equal to zero) to the variable attenuator 3.

The variable attenuator 3 has a function of changing (attenuating) the amplitude of the one distributed signal input from the variable phaser 2 with the amount of change (attenuation) in amplitude controlled by a voltage signal input from the LPF 7 to generate amplitude distortions in the one distributed signal. The variable attenuator 3 outputs the one distributed signal applied with the amplitude distortions (including the amount of distortions equal to zero) to the power amplifier 4.

The power amplifier 4 amplifies the one distributed signal input from the variable attenuator 3, and outputs the amplified signal. The envelope detector 5 detects information on the envelope (envelope information) of the other distributed signal input from the directional coupler 1, and outputs the detected envelope information to the memory 8. The LPF 6 filters a voltage signal input from the memory 8, and outputs the filtered voltage signal to a control terminal of the variable phaser 2. The LPF 7 filters a voltage signal input from the memory 8, and outputs the filtered voltage signal to a control terminal of the variable attenuator 3.

The memory 8 applies the LPF 6 with a voltage signal for controlling the variable phaser 2 based on the result of the detected envelope information input from the envelope detector 5 so as to compensate for distortions generated by the power amplifier 4, and applies the LPF 7 with a voltage signal for controlling the variable attenuator 3.

Specifically, the memory 8 stores, for example, control values for the variable phaser 2 and control values for the variable attenuator 3 corresponding to the envelope information (the level of an envelope indicated thereby). The memory 8 outputs a control value for the variable phaser 2 and a control value for the variable attenuator 3 as voltage signals corresponding to the result of detected envelope information input from the envelope detector 5, thereby controlling the variable phaser 2 and the variable attenuator 3, respectively.

Then, the control value for the variable phaser 2 is set such that the variable phaser 2 generates distortions which cancel phase distortions generated by the power amplifier 4 (predistortions), while the control value for the variable attenuator 3 is set such that the variable attenuator 3 generates distortions which cancel amplitude distortions generated by the power amplifier 4 (predistortions), thereby making it possible to compensate for the phase distortions and amplitude distortions generated by the power amplifier 4 according to the predistortion scheme. In other words, the distortions included in an amplified signal output from the power amplifier 4 can be suppressed to be smaller (ideally to zero).

In the exemplary configuration illustrated in FIG. 1, the directional coupler 1 constitutes distributing means as referred to in the present invention; the variable phaser 2 and the variable attenuator 3 constitute distortion generating means as referred to in the present invention; the power amplifier 4 constitutes an amplifier as referred to in the present invention; the envelope detector 5 constitutes an envelope information detector as referred to in the present invention; and the memory 8 and the two LPFs 6, 7 constitute distortion control means as referred to in the present invention.

Next, an exemplary configuration of an envelope information detector (corresponding to the envelope detector 5 in FIG. 1) included in the predistortion-based amplifier according to the present invention will be described as a first embodiment.

Figure 2:
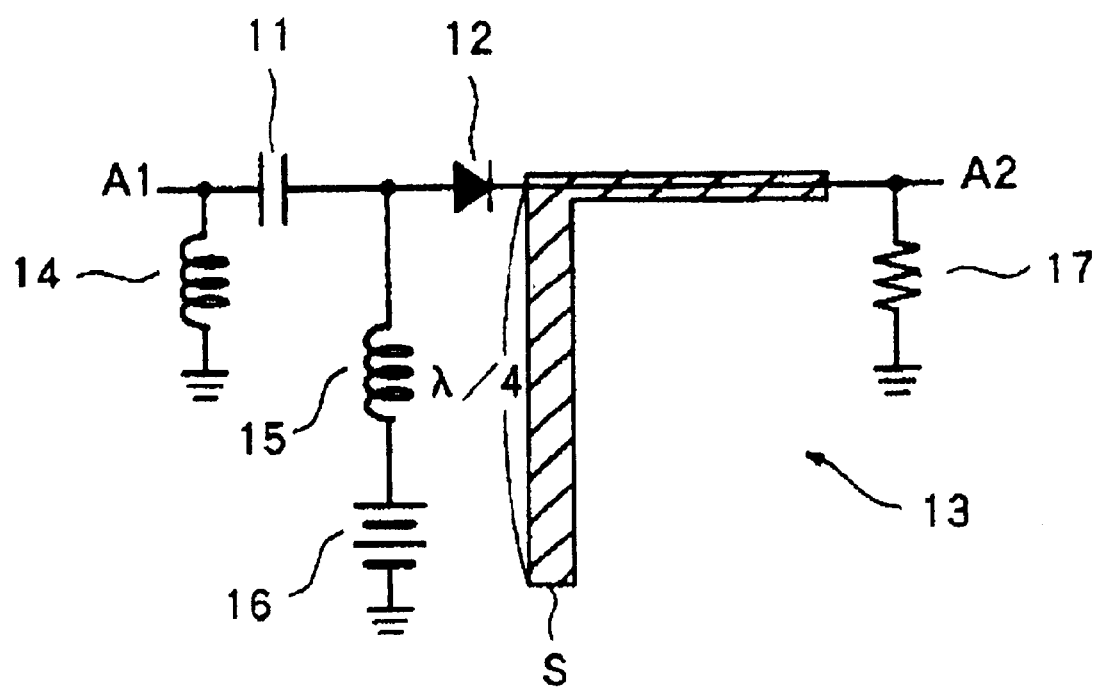
FIG. 2 is a schematic diagram illustrating an exemplary circuit configuration of an envelope information detector according to a first embodiment of the present invention.

FIG. 2 illustrates an exemplary circuit configuration of the envelope information detector according to this embodiment. The illustrated envelope information detector comprises a matching capacitor 11; a diode 12 for rectifying a signal; an L-shaped microstrip line 13 having a stub portion S; a matching coil 14; an RF choke coil 15 for biasing the diode 12; a voltage source 16 for biasing the diode 12; and a resistor 17. For the diode 12, a Schottky diode, for example, is employed because of its ability to operate at a high speed and detect high frequencies. In FIG. 2, the microstrip line 13 is shaded for facilitating identification thereof.

Specifically, in the envelope information detector illustrated in FIG. 2, an input terminal A1 which receives a imodulated wave signal (the other distributed signal output from the directional coupler 1 in the configuration of FIG. 1) is connected to one end of the matching capacitor 11, the other end of which is connected to an anode of the diode 12. A cathode of the diode 12 is connected to one end of a side of the L-shaped microstrip line 13 (at the corner). The other end of the side of the microstrip line 13 is connected to an output terminal A2. In this way, the side of the microstrip line 13 is used as a signal path for connecting between the diode 12 and the output terminal A2.

A point between the input terminal A1 and the matching capacitor 11 is grounded through the matching coil 14, and the biasing voltage source 16 is connected between the matching capacitor 11 and the diode 12 through the RF choke coil 15. A point between the microstrip line 13 and the output terminal A2 is grounded through the resistor 17.

In the envelope information detector illustrated in FIG. 2, the matching capacitor 11 and the matching coil 14 constitute a matching circuit. One of the two sides comprising the microstrip line 13, which is not connected between the diode 12 and the output terminal A2, constitutes the stub portion S, and in this embodiment, thereby constitutes a wiring pattern for an open stub. Also, as illustrated in FIG. 2, in this embodiment, the length of the stub portion S is chosen to be one quarter of the wavelength of the carrier component of the modulated wave signal. The microstrip line 13 having the stub portion S as in this embodiment has a function of removing a carrier component of a signal output from the diode 12 to the output terminal A2 (the carrier component of the modulated wave signal).

Next, an exemplary operation of the envelope information detector of this embodiment illustrated in FIG. 2 will be shown below.

In the illustrated envelope information detector, a modulated wave signal input to the input terminal A1 is applied to the anode of the diode 12 through the matching circuit, and a voltage component of the modulated wave signal is generated at the anode of the diode 12. Then, the microstrip line 13 is disposed on the cathode side of the diode 12, wherein the microstrip line 13 is configured such that its wiring pattern may be regarded as being short-circuited at the carrier frequency of the modulated wave signal in the AC domain, so that a potential difference between the anode and cathode of the diode 12 is converted to a current by the diode 12. Simultaneously with this, the modulated wave signal is separated into a carrier wave component and an envelope component by a rectifying action of the diode 12.

Since the microstrip line 13 is configured such that its wiring pattern may be regarded as being short-circuited at the carrier frequency of the modulated wave signal in the AC domain, as the current signal converted by the diode 12 passes through the microstrip line 13, the carrier component of the signal (alone) is removed, so that the envelope information (alone) remains and is output from the microstrip line 13. Then, the envelope information output from the microstrip line 13 is converted from the current signal to a voltage signal by the resistor 17, and supplied to a subsequent processing circuit (the memory 8 in the exemplary configuration of FIG. 1) from the output terminal A2.

Figure 9:
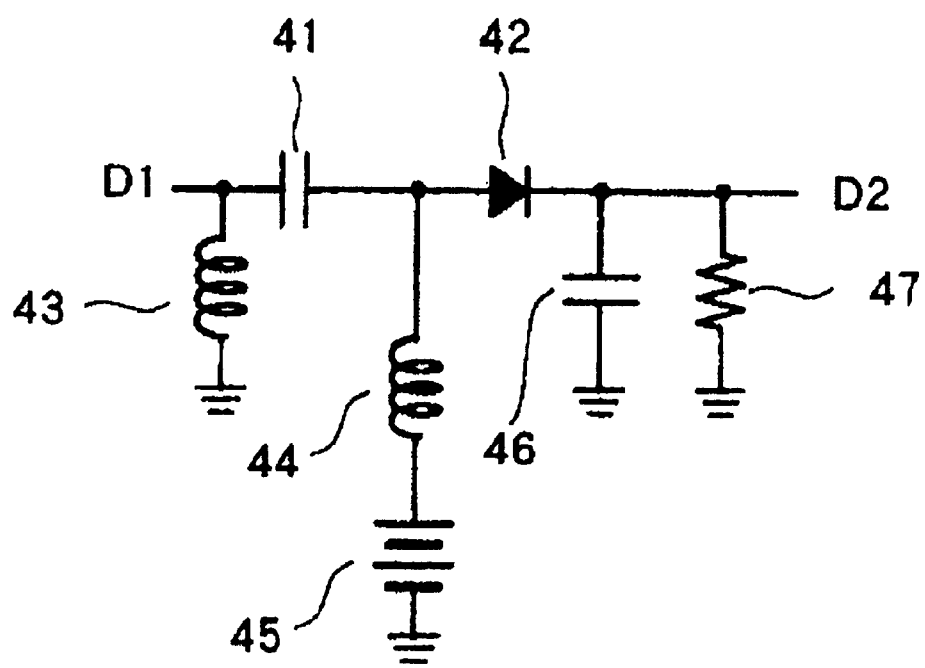
FIG. 9 is a schematic diagram illustrating an exemplary circuit configuration of an envelope information detector according to a prior art example.

Here, the envelope information detector using the stub as in this embodiment is advantageous in that a capacitor (for example, corresponding to the capacitor 46 illustrated in the prior art example of FIG. 9) need not be connected on the cathode side of the diode 12. Specifically, in the envelope information detector of the prior art example illustrated in FIG. 9, for example, the envelop detecting efficiency and detecting accuracy are dominated in accordance with the time constant which is determined by the capacitance of the capacitor 46 and the resistance of the resistor 47, whereas in the envelope information detector of this embodiment, the envelope detecting efficiency is determined in accordance with the accuracy of the microstrip line 13 (for example, the accuracy of the length of the stub portion S, or the like), and the envelope detecting accuracy is determined in accordance with the characteristics of the diode 12, unlike the prior art.

The reason for the foregoing lies in that the microstrip line 13 of this embodiment acts as being short-circuited at frequencies near the frequency of the carrier component, as well as acts as a line which (simply) passes a signal at the frequency of the envelope component. Since the microstrip line 13 does not have the resistance or time constant, it will not remove the frequency component of the envelope.

Therefore, the envelope information detector of this embodiment included in the predistortion-based amplifier can simultaneously improve both the envelope information detecting efficiency and detecting accuracy, for example, as compared with the prior art, thereby making it possible to improve the accuracy in distortion compensation in accordance with the predistortion scheme. Also, since the microstrip line 13 can be generally provided at a low cost, the envelop information detector of this embodiment can be realized at a low cost.

It should be noted that in the envelope information detector illustrated in FIG. 2, the biasing voltage source 16, biasing RF choke coil 15 and diode 12 constitute a diode circuit as referred to in the present invention; and the microstrip line 13 having the stub portion S constitutes a stub circuit as referred to in the present invention.

Figure 3:
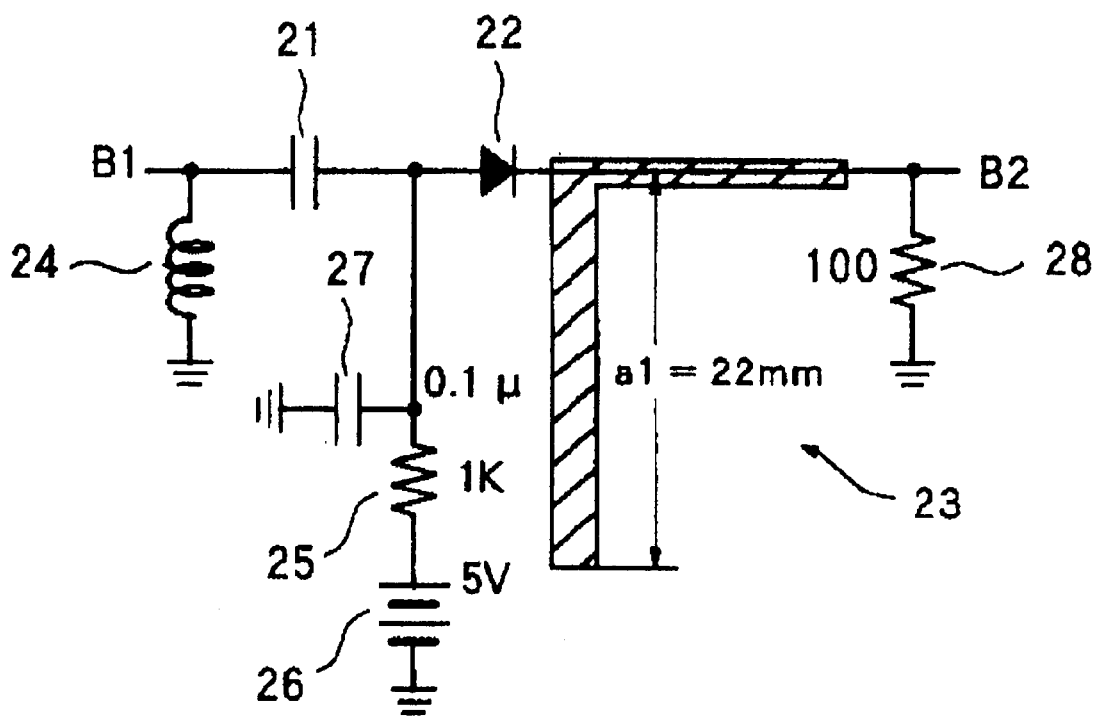
FIG. 3 is a schematic diagram illustrating an exemplary circuit configuration of the envelope information detector according to the first embodiment of the present invention in a more specific manner.

FIG. 3 illustrates an exemplary circuit configuration of the envelope information detector according to this embodiment in a more specific manner. The illustrated envelope information detector comprises, as components similar to those illustrated in FIG. 2 between an input terminal B1 and an output terminal B2, a matching capacitor 21; a diode 22; an L-shaped microstrip line 23; a matching coil 24; a voltage source 26 for biasing the diode 22; and a resistor 28 connected between an output terminal B2 and the ground for current-to-voltage conversion. In FIG. 3, the microstrip line 23 shaded for facilitating identification thereof.

Also, in the circuit configuration illustrated in FIG. 3, a point between the matching capacitor 21 and the diode 22 is connected to the biasing voltage source 26 through the biasing resistor 25. Also, a point between the point between the matching capacitor 21 and the diode 22 and the biasing resistor 25 is grounded through a source noise removing capacitor 27 for removing noise from the voltage source 26. Then, the diode 22 is appropriately biased by the biasing voltage source 26, biasing resistor 25 and resistor 28 for current-to-voltage conversion.

FIG. 3 illustrates an exemplary circuit configuration where a substrate used to form a circuit of the envelope information detector thereon is made of BT resin which has a dielectric constant of 2.6, and a modulated wave signal has a carrier frequency at 2.12 GHz.

Also, as an example of the illustrated configuration, the open stub portion of the microstrip line 23 has a length al equal to 22 mm which corresponds to one quarter of the wavelength λ of a carrier component, thereby resulting in the cathode of the diode 22 being short-circuited at the carrier frequency in the AC domain. Further, a 5-volt power source is used as the biasing voltage source 26; a 1 KΩ resistor is used as the biasing resistor 25; a 0.1 μF capacitor is used as the power noise removing capacitor 27; and a 100 ω resistor is used as the resistor 28 for current-to-voltage conversion.

The wavelength λ of the carrier component is calculated by Equation 1 with the velocity of light equal to 300000000 m/s, the frequency f of the carrier component equal to 2.12 GHz and the dielectric constant ε of the substrate equal to 2.6:

$$\lambda = c/(f \times sqrt(\epsilon)) \qquad \text{Equation 1}$$

where sqrt(ε) represents a square root of ε.

Figure 4:
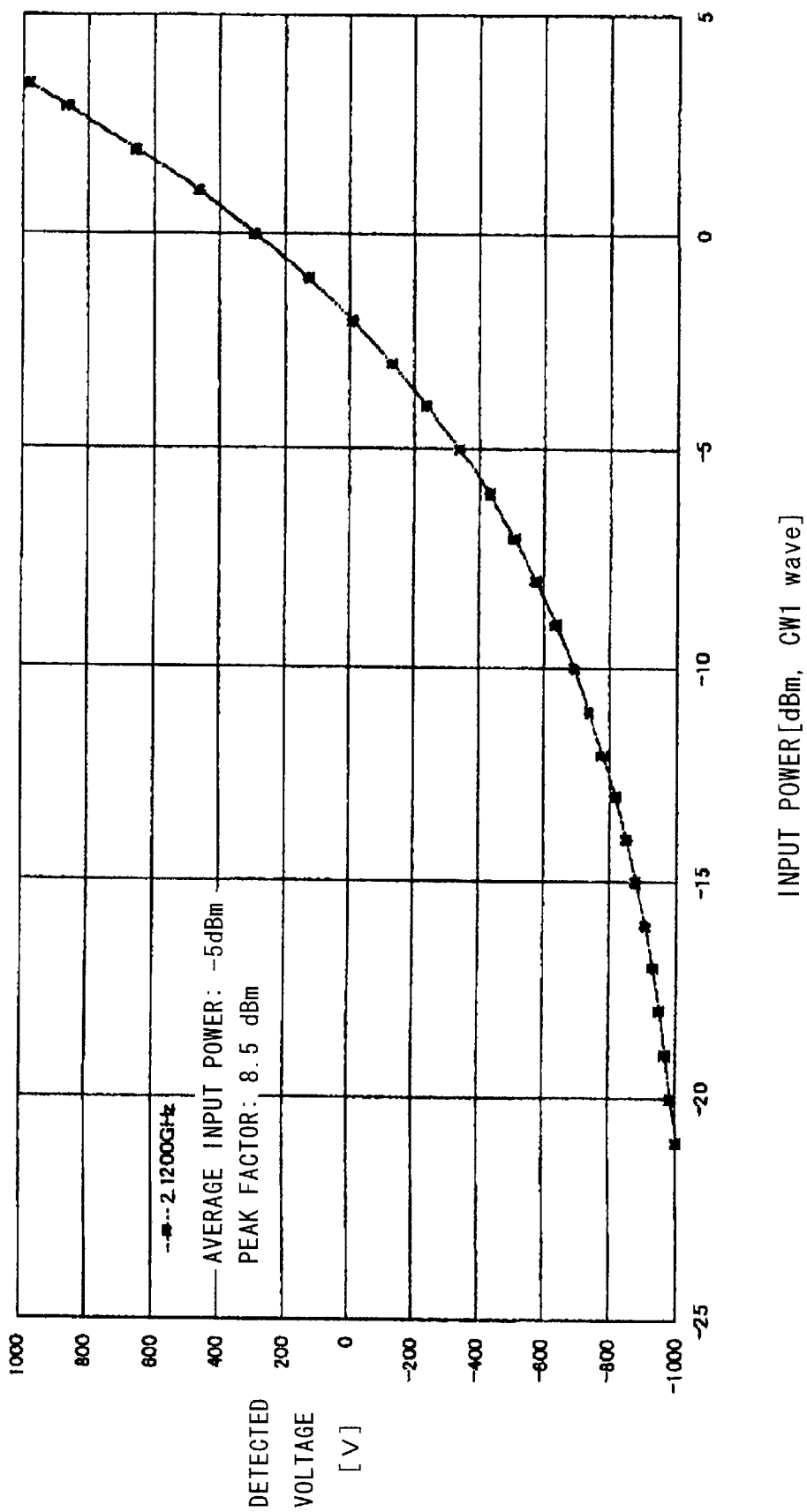
FIG. 4 is a graph showing an example of a relationship between input power and an envelope detection voltage.

FIG. 4 shows an example of a relationship between the power of a signal input to the envelope information detector illustrated in FIG. 3 (input voltage) and a voltage of an envelope component detected by the envelope information detector (detected voltage), where the horizontal axis of the graph indicates the input voltage [dBm, CW one wave], and the vertical axis indicates the detected voltage [V].

Figure 5:
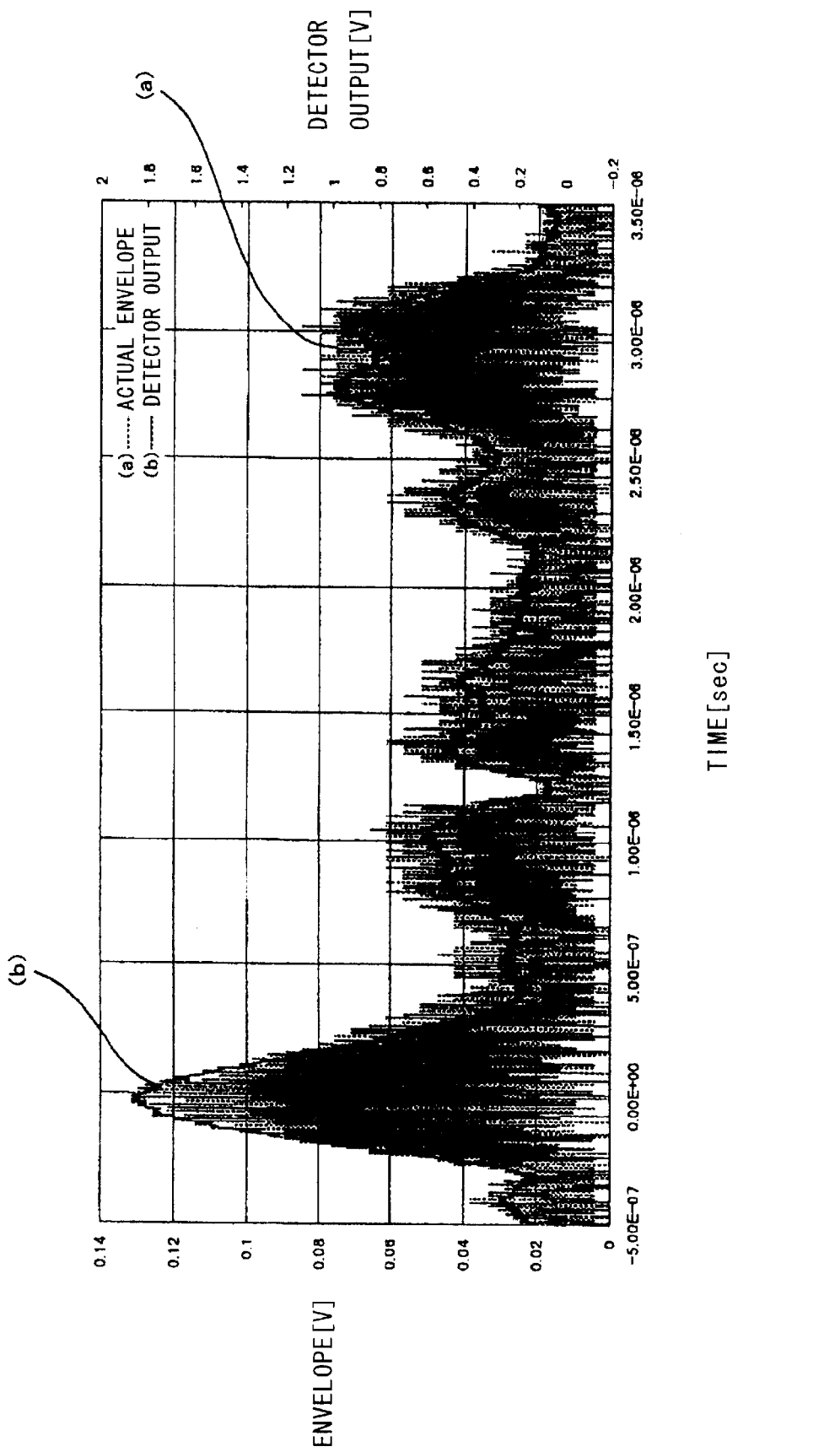
FIG. 5 is a diagram showing, by way of example, how an envelope is detected.

FIG. 5 shows, by way of example, how an envelope is detected when a wideband CDMA-based (for example, W-CDMA-based) waveform signal is used as a modulation wave signal, where the horizontal axis of the graph indicates the time [sec], the vertical axis on the left side indicates a voltage value [V] of an actual envelope component, and the vertical axis on the right side indicates a voltage value [V] of an envelope component detected by and output from the envelope information detector of this embodiment. The CDMA-based waveform signal used in this example is multiplexed with signals for 50 users with the carrier frequency of 2.1125 GHz and a chip rate of 3.84 Mcps. Also, in the graph of FIG. 5, the voltage value of the actual envelope component is labeled (a), while the voltage value of the envelope component detected by the envelope detector of this embodiment is labeled (b).

As shown in the foregoing graph, the envelope information detector of this embodiment can increase the detected voltage value of the envelope component to approximately 1000 mV, while the conventional envelope information detector as illustrated in FIG. 9, for example, can provide at most several tens of millivolts for a detected voltage value of an envelope component when the voltage value of the envelope component is detected at a high accuracy.

Figure 6:
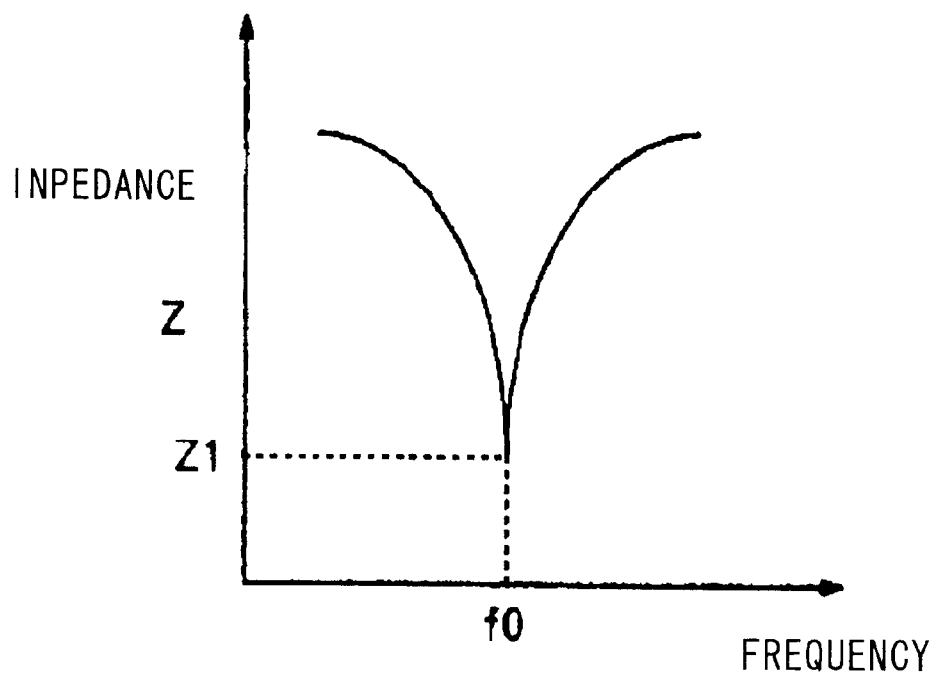
FIG. 6 is a graph showing an example of a relationship between the frequency and the impedance according to the first embodiment of the present invention.

FIG. 6 generally shows an example of a relationship between the frequency f and the impedance Z when a microstrip line having a stub portion, as in this embodiment, is used, where the horizontal axis of the graph indicates the frequency, and the vertical axis indicates the impedance. As shown in FIG. 6, when the microstrip line has one stub portion, the impedance exhibits a minimum value Z1 at a predetermined frequency f0.

As described above, the envelope information detector included in the predistortion-based amplifier, according to the present invention, comprises an open stub at an output terminal of a diode, the rectifying action of which is utilized. More specifically, in this embodiment, the envelope information detector comprises a matching unit comprised of a matching circuit; a diode for performing a rectifying action; an open stub for removing a carrier frequency; and a voltage signal converter for converting an envelope component to a voltage signal, thereby detecting the envelope of a high frequency signal.

Then, the predistortion-based amplifier of this embodiment comprises, for example, a directional coupler for distributing a signal; the envelope information detector of this embodiment described above; a memory for storing information related to an envelope and a control value in correspondence; a variable phaser for correcting distortions in a phase component of a signal to be amplified based on the control value stored in the memory; a variable attenuator for correcting distortions in an amplitude component of the signal to be amplified based on the control value stored in the memory; and a power amplifier for amplifying the signal having phase distortions corrected by the variable phaser and amplitude distortions corrected by the variable attenuator to output the amplified signal. With this configuration, the predistortion-based amplifier compensates for distortions generated in a high frequency signal when the signal is amplified by the power amplifier.

An example of a preferred amplifier, to which the predistortion-based amplifier of this embodiment is applied, may be a common amplifier (C-AMP) used in a base station unit in a mobile radio communication system. Specifically, while a common amplifier for a base station unit employing a current feed-forward scheme exhibits an efficiency of 10% or less, it is contemplated that a higher efficiency is expected if the predistortion scheme using the envelope information detector of this embodiment is applied to such a common amplifier. In addition, if a higher efficiency is accomplished, a heat sink can be reduced in size, so that the overall common amplifier can be reduced in size.

Next, another exemplary configuration of an envelope information detector (corresponding to the envelope detector 5 in FIG. 1) included in the predistortion-based amplifier according to the present invention will be described as a second embodiment with reference to FIG. 7.

Figure 7:
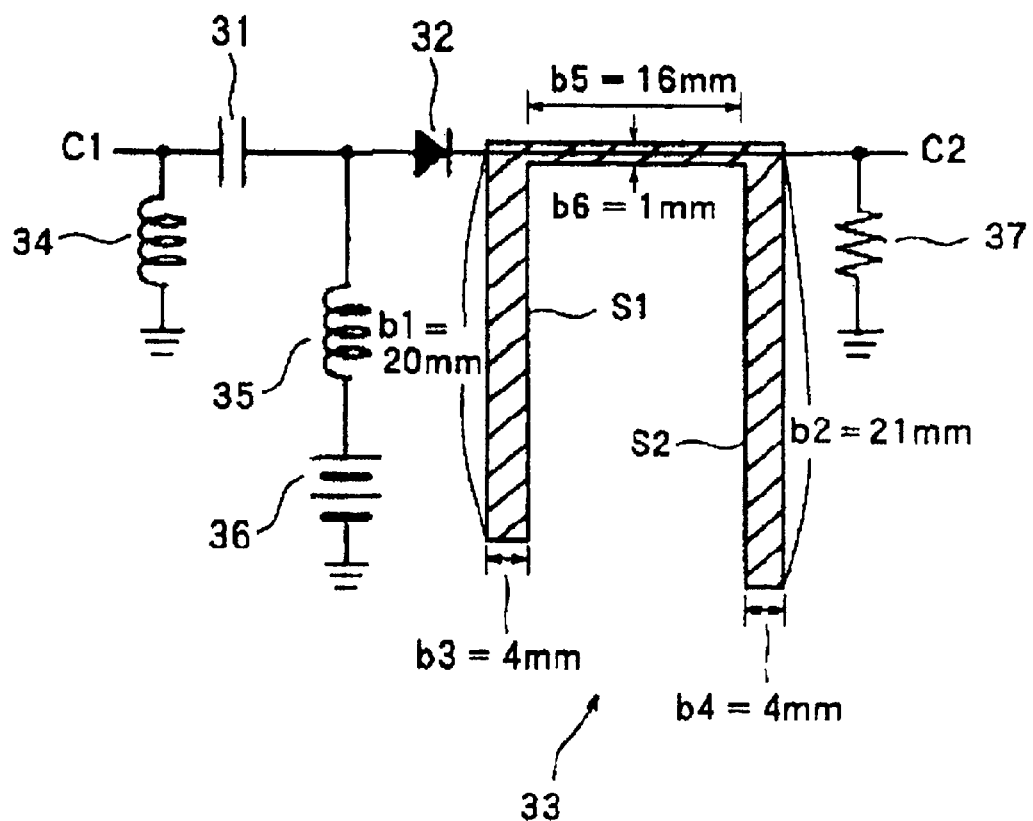
FIG. 7 is a schematic diagram illustrating an exemplary circuit configuration of an envelope information detector according to a second embodiment of the present invention.

FIG. 7 illustrates an exemplary circuit configuration of the envelope information detector according to this embodiment. This envelope information detector comprises, for example, a matching capacitor 31; a diode (Schottky barrier diode) 32; a matching coil 34; an RF choke coil 35 for biasing the diode 32; a voltage source 36 for biasing the diode 32; and a resistor 32 between an input terminal C1 and an output terminal C2, as components similar to those in the envelope information detector illustrated in FIG. 2 of the first embodiment.

Also, the envelope information detector of this embodiment comprises, as a characteristic component of this embodiment, an inverted C-shaped microstrip line 33 having two stub portions S1, S2 between the cathode of the diode 32 and the output terminal C2. In FIG. 7, the microstrip line 33 is shaded for facilitating identification thereof.

Specifically, in the circuit configuration illustrated in FIG. 7, within three sides comprising the inverted C-shaped microstrip line 33, one side positioned between the remaining two sides has one end connected to the cathode of the diode 32 (at one corner), and the other end connected to the output terminal C2 (at the other corner). In this way, the side of the microstrip line 33 is used as a signal line for connecting between the diode 32 and the output terminal C2.

The remaining two sides comprising the microstrip line 33 constitute the stub portions S1, S2, respectively. In this embodiment, these stub portions S1, S2 make up wiring patterns of the two open stubs. Also, as shown in FIG. 7, the lengths of the two stub portions S1, S2 are chosen to be on the order of one quarter of the wavelength of a carrier component of a modulated wave signal, and are different from each other. The microstrip line 33 having the stub portions S1, S2 as in this embodiment has a function of removing the carrier component of a signal (carrier component of the modulated wave signal) output from the diode 32 to the output terminal C2.

In FIG. 7, as is the case with the configuration of the microstrip line 33, for example, illustrated in FIG. 3, a substrate used to form a circuit of the envelope information detector thereon is made of BT resin which has a dielectric constant of 2.6, and a modulated wave signal has a carrier frequency at 2.12 GHz.

Specifically, in the microstrip line 33 of this embodiment, the stub portion S1 near the diode 32 has a length b1 equal to 20 mm and a width b3 equal to 4 mm, the stub portion S2 near the output terminal C2 has a length b2 equal to 21 mm and a width b4 equal to 4 mm, and a signal path between the diode 32 and the output terminal C2 has a length b5 equal to 16 mm, and a width b6 equal to 1 mm.

Generally, the impedance of an open stub, though depending on the material of the substrate, is determined by the width of the open stub.

The shape, size and so on of a stub portion can be established, for example, by conducting simulations as required.

Figure 8:
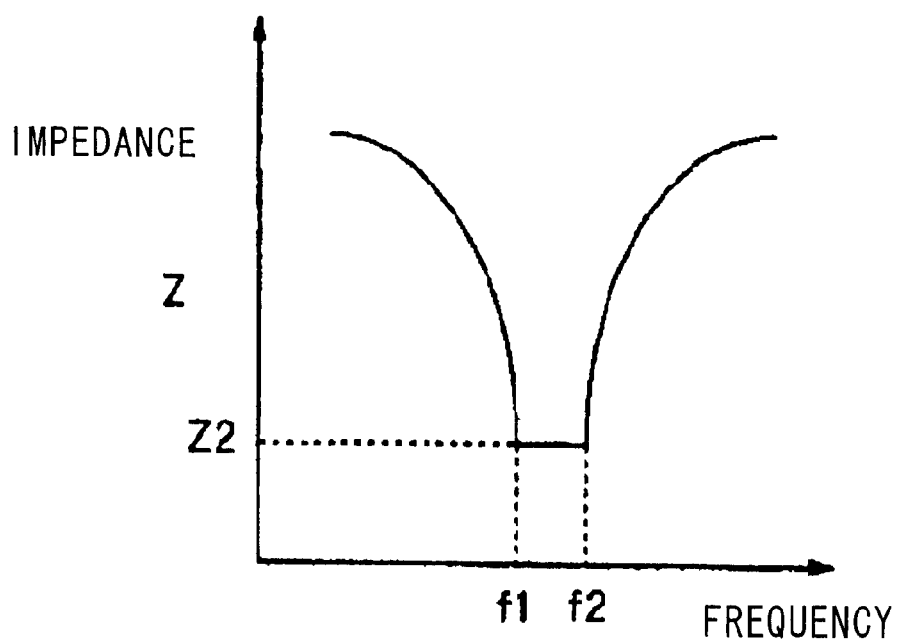
FIG. 8 is a graph showing an example of a relationship between the frequency and the impedance according to the second embodiment of the present invention.

FIG. 8 generally shows an example of a relationship between the frequency f and the impedance Z when the microstrip line 33 having the two stub portions S1, S2 as in this embodiment is used, where the horizontal axis of the graph indicates the frequency, and the vertical axis indicates the impedance. In the graph of FIG. 8, one frequency f1 corresponds to a frequency of one stub portion S1. In this embodiment, the stub portion S1 has the length equal to one quarter of a wavelength λ1 corresponding to the frequency f1. The other frequency f2 shown in the graph of FIG. 8, in turn, corresponds to a frequency of the other stub portion S2. In this embodiment, the stub portion S2 has the length equal to one quarter of a wavelength 2 corresponding to the frequency f2.

When using the microstrip line 33 having the two stub portions S1, S2 as in this embodiment, the envelope information detector exhibits the characteristic which is comparable to the sum of two overlapped characteristics as shown, for example, in FIG. 6. Generally, however, the characteristic may be represented by the graph of FIG. 8. Specifically, as shown in FIG. 8, when a microstrip line has two stub portions, the impedance exhibits a constant minimum value Z2 generally in a frequency region between the predetermined frequency f1 and the predetermined frequency f2.

As described above, the envelope information detector of this embodiment can minimize the impedance in a frequency range having certain width, thereby making it possible to improve the envelope detecting efficiency and detecting accuracy in such a frequency region having certain width, even when a frequency band of a modulated wave signal to be amplified has a width and extends over a wideband, for example, as is the case with the W-CDMA scheme. Thus, the predistortion-based amplifier of this embodiment can improve a distortion compensation accuracy and so on in accordance with the predistortion scheme.

As described above, the envelope information detector included in the predistortion-based amplifier of this embodiment comprises a plurality of open stubs at an output terminal of a diode, the rectifying action of which is utilized. Such a configuration is preferred when a wideband signal, for example, a W-CDMA based signal is processed.

Thus, the envelope information detector included in the predistortion-based amplifier of this embodiment can improve both the envelope information detecting efficiency and detecting accuracy, for example, as compared with the prior art, even when a wideband signal, for example, of the W-CDMA scheme is processed, thereby making it possible to improve a distortion compensating accuracy and so on in accordance with the predistortion scheme. Also, since the microstrip line 33 can be generally provided at a low cost, the envelop information detector of this embodiment can be realized at a low cost.

It should be understood that the predistortion-based amplifier, transmitter and envelope detector according to the present invention are not limited in configuration to those shown above, but a variety of configurations may be employed instead.

Also, applicable fields of the present invention are not necessarily limited to that shown above, but the present invention can be applied to a variety of fields. For example, the predistortion-based amplifier, transmitter and envelope detector according to the present invention can be applied not only to those using the RF predistortion scheme but also to those using, for example, the If predistortion scheme. Further, for example, the envelope information detector according to the present invention may be applied to a variety of devices for detecting envelope information.

In addition, the predistortion-based amplifier according to the present invention is preferably applied to a transmitter for a mobile radio communication system which employs a communication scheme such as, for example, the CDMA scheme. Such a transmitter may comprise a predistortion-based amplifier, for example, as shown in the foregoing embodiments, for amplifying a modulated wave signal to be transmitted using the predistortion-based amplifier before transmission.

A variety of processing possibly performed by the predistortion-based amplifier, transmitter and envelope detector according to the present invention may be controlled in a hardware resources including, for example, a processor, a memory and so on by the processor which executes a control program stored in a ROM. Alternatively, respective functional means for executing the processing may be configured, for example, as hardware circuits independent of one another.

The foregoing processing may be implemented by a computer readable recording medium such as a floppy disk, a CD-ROM or the like having stored thereon the control program, or by the control program itself, in which case the processing according to the present invention can be carried out by inputting the control program from the recording medium to a computer so that the processor executes the control program.

As described above, the predistortion-based amplifier according to the present invention comprises distributing means for distributing a modulated wave signal to be amplified, distortion generating means for generating at least one of amplitude distortions and phase distortions in one of distributed signals, an amplifier for amplifying the one distributed signal including the distortion generated by the distortion generating means, an envelope information detector for detecting information related to the envelope of the other distributed signal, and distortion control means for controlling the distortions generated by the distortion generating means so as to compensate for distortions generated by the amplifier based on the result of a detection by the envelope information detector, wherein the envelope information detector includes a stub circuit for removing a carrier component of the modulated wave signal. Thus, the envelope information detector can improve both the envelope information detecting efficiency and detecting accuracy, thereby making it possible to improve the distortion compensating accuracy and so on in accordance with the predistortion scheme.

A predistortion-based amplifier according the present invention has an envelope information detector using a stub circuit including a plurality of stub portions, so that even if a modulated wave signal to be amplified has certain width of frequency band, the envelope information detecting efficiency and detecting accuracy can be improved in such a frequency region having the width, thereby making it possible to improve the distortion compensating accuracy and so on in accordance with the predistortion scheme.

A transmitter according to the present invention comprises a predistortion-based amplifier as shown above so that a modulated wave signal to be transmitted is amplified by the predistortion-based amplifier for transmission, thereby making it possible to improve the distortion compensating accuracy and so on in accordance with the predistortion scheme and hence improve a communication efficiency and so on.

A transmitter for a CDMA-based mobile radio communication system according to the present invention comprises a predistortion-based amplifier including a stub circuit having a plurality of stub portions as described above, so that a modulated wave signal to be transmitted is amplified by the ppredistortion-based amplifier for transmission, thereby making it possible to improve the distortion compensating accuracy and so on in accordance with the predistortion scheme, corresponding to a wideband signal, and hence improve a communication efficiency and so on.

An envelope detector according to the present invention employs a diode circuit for rectifying a modulated wave signal, and a stub circuit for removing a carrier component of a signal output from the diode circuit to detect information related to the envelope of the modulated wave signal, thereby making it possible to improve the envelope information detecting efficiency in accordance with the characteristic of the stub circuit as well as to improve the envelope information detecting accuracy in accordance with the characteristic of the diode circuit. Consequently, the envelope detector of the present invention can improve both the envelope detecting efficiency and detecting accuracy.

What is claimed is:

1. A predistortion-based amplifier comprising:
   distributing means for distributing a modulated wave signal to be amplified;
   distortion generating means for generating at least one of amplitude distortion and phase distortion in one of distributed signals;
   an amplifier for amplifying the one distributed signal including the distortion generated by said distortion generating means;
   an envelope information detector for detecting information related to an envelope of the other distributed signal; and distortion control means for controlling the distortion generated by said distortion generating means so as to compensate for a distortion generated by said amplifier based on the result of a detection by said envelope information detector, wherein said envelope information detector is constituted by using a stub circuit for removing a carrier component of the modulated wave signal.

2. The predistortion-based amplifier according to claim 1, wherein:

said stub circuit of said envelope information detector includes a plurality of stub portions.

3. The predistortion-based amplifier according to claim 1, wherein:

said envelope information detector includes a matching capacitor, a diode for rectifying a signal, an L-shaped microstrip line having a stub portion, a matching coil, an RF choke coil for biasing said diode, a voltage source for biasing said diode, and a resistor, wherein an input terminal for receiving the modulated wave signal is connected to one end of said matching capacitor, the other end of which is connected to an anode of said diode, a cathode of said diode is connected to one end of one side of said L-shaped microstrip line, the other end of the one side of said L-shaped microstrip line is connected to an output terminal, a point between said input terminal and said matching capacitor is grounded through said matching coil, said biasing voltage source is connected between said matching capacitor and said diode through said RF choke coil, and a point between said microstrip line and said output terminal is grounded through said resistor.

4. The predistortion-based amplifier according to claim 2, wherein:

said envelope information detector includes a matching capacitor, a diode for rectifying a signal, an inverted C-shaped microstrip line having two stub portions, a matching coil, an RF choke coil for biasing said diode, a voltage source for biasing said diode, and a resistor, wherein an input terminal for receiving the modulated wave signal is connected to one end of said matching capacitor, the other end of which is connected to an anode of said diode, a cathode of said diode is connected to one end of one side positioned between the remaining two sides of said inverted C-shaped microstrip line, the other end of the one side of said inverted C-shaped microstrip line is connected to an output terminal, a point between said input terminal and said matching capacitor is grounded through said matching coil, said biasing voltage source is connected between said matching capacitor and said diode through said RF choke coil, and a point between said microstrip line and said output terminal is grounded through said resistor.

5. A transmitter comprising a predistortion-based amplifier for amplifying a modulated wave signal to be transmitted, said transmitter transmitting the amplified modulated wave signal, said predistortion-based amplifier comprising:

distributing means for distributing a modulated wave signal to be amplified;

distortion generating means for generating at least one of amplitude distortion and phase distortion in one of distributed signals;

an amplifier for amplifying the one distributed signal including the distortion generated by said distortion generating means;

an envelope information detector for detecting information related to an envelope of the other distributed signal; and distortion control means for controlling the distortion generated by said distortion generating means so as to compensate for a distortion generated by said amplifier based on the result of a detection by said envelope information detector, wherein said envelope information detector provided on the predistortion-based amplifier is constituted by using a stub circuit for removing a carrier component of the modulated wave signal.

6. The transmitter according to claim 5, wherein:

said stub circuit of said envelope information detector forming part of said predistortion-based amplifier includes a plurality of stub portions.

7. The transmitter according to claim 6, wherein:

said transmitter is for use in a CDMA-based mobile radio communication system.

8. The transmitter according to claim 5, wherein:

said envelope detector forming part of said predistortion-based amplifier includes a matching capacitor, a diode for rectifying a signal, an L-shaped microstrip line having a stub portion, a matching coil, an RF choke coil for biasing said diode, a voltage source for biasing said diode, and a resistor, wherein an input terminal for receiving the modulated wave signal is connected to one end of said matching capacitor, the other end of which is connected to an anode of said diode, a cathode of said diode is connected to one end of one side of said L-shaped microstrip line, the other end of the one side of said L-shaped microstrip line is connected to an output terminal, a point between said input terminal and said matching capacitor is grounded through said matching coil, said biasing voltage source is connected between said matching capacitor and said diode through said RF choke coil, and a point between said microstrip line and said output terminal is grounded through said resistor.

9. The transmitter according to claim 6, wherein:

said envelope information detector forming part of said predistortion-based amplifier includes a matching capacitor, a diode for rectifying a signal, an inverted C-shaped microstrip line having two stub portions, a matching coil, an RF choke coil for biasing said diode, a voltage source for biasing said diode, and a resistor, wherein an input terminal for receiving the modulated wave signal is connected to one end of said matching capacitor, the other end of which is connected to an anode of said diode, a cathode of said diode is connected to one end of one side positioned between the remaining two sides of said inverted C-shaped microstrip line, the other end of the one side of said inverted C-shaped microstrip line is connected to an output terminal, a point between said input terminal and said matching capacitor is grounded through said matching coil, said biasing voltage source is connected between said matching capacitor and said diode through said RF choke coil, and a point between said microstrip line and said output terminal is grounded through said resistor.

10. The transmitter according to claim 7, wherein:

said envelope information detector forming part of said predistortion-based amplifier includes a matching capacitor, a diode for rectifying a signal, an inverted C-shaped microstrip line having two stub portions, a matching coil, an RF choke coil for biasing said diode, a voltage source for biasing said diode, and a resistor, wherein an input terminal for receiving the modulated wave signal is connected to one end of said matching capacitor, the other end of which is connected to an anode of said diode, a cathode of said diode is connected to one end of one side positioned between the remaining two sides of said inverted C-shaped microstrip line, the other end of the one side of said inverted C-shaped microstrip line is connected to an output terminal, a point between said input terminal and said matching capacitor is grounded through said matching coil, said biasing voltage source is connected between said matching capacitor and said diode through said RF choke coil, and a point between said microstrip line and said output terminal is grounded through said resistor.

* * * * *